United States Patent
Lee et al.

(10) Patent No.: US 8,557,046 B2
(45) Date of Patent: Oct. 15, 2013

(54) DEPOSITION SOURCE

(75) Inventors: Jong-Woo Lee, Yongin (KR);
Tae-Seung Kim, Yongin (KR);
Chang-Soon Ji, Yongin (KR);
Won-Seok Cho, Yongin (KR);
Hey-Yeon Shim, Yongin (KR);
Yong-Hun Jo, Yongin (KR); Sang-Jin Han, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 700 days.

(21) Appl. No.: 12/769,879

(22) Filed: Apr. 29, 2010

(65) Prior Publication Data
US 2010/0275841 A1    Nov. 4, 2010

(30) Foreign Application Priority Data
Apr. 30, 2009    (KR) ........................ 10-2009-0038451

(51) Int. Cl.
*C23C 16/00*    (2006.01)
(52) U.S. Cl.
USPC ............................................ 118/726; 118/727
(58) Field of Classification Search
USPC .................................................. 118/726, 727
See application file for complete search history.

(56) References Cited

U.S. PATENT DOCUMENTS

| | | | |
|---|---|---|---|
| 6,202,591 B1 | 3/2001 | Witzman et al. | |
| 6,830,626 B1 * | 12/2004 | Smith | ........................... 118/726 |
| 2001/0008121 A1 | 7/2001 | Tanabe et al. | |
| 2004/0123804 A1 * | 7/2004 | Yamazaki et al. | ...... 118/723 VE |
| 2004/0144321 A1 * | 7/2004 | Grace et al. | .................... 118/726 |
| 2005/0016463 A1 * | 1/2005 | Hirano | .......................... 118/726 |
| 2006/0147613 A1 | 7/2006 | Hwang et al. | |
| 2006/0162662 A1 | 7/2006 | Sato et al. | |
| 2007/0178225 A1 * | 8/2007 | Takanosu et al. | ............... 427/69 |
| 2007/0221131 A1 | 9/2007 | Yoshikawa et al. | |
| 2007/0231460 A1 * | 10/2007 | Ukigaya | ........................... 427/8 |
| 2007/0283890 A1 | 12/2007 | Park et al. | |
| 2008/0014825 A1 * | 1/2008 | Fukuda et al. | ................... 445/46 |
| 2009/0250007 A1 * | 10/2009 | Kim et al. | ..................... 118/726 |

FOREIGN PATENT DOCUMENTS

| | | | |
|---|---|---|---|
| JP | 62-169321 A | | 7/1987 |
| JP | 01-208453 A | | 8/1989 |
| JP | 05-299163 | * | 11/1993 |
| JP | 2006-188762 A | | 7/2006 |
| JP | 2007-186787 A | | 7/2007 |
| JP | 2007-332458 A | | 12/2007 |
| KR | 1020040110718 A | | 12/2004 |
| KR | 100666573 B1 | | 1/2007 |
| KR | 100805531 | | 2/2008 |

OTHER PUBLICATIONS

English translation of JP 05-299163, Amano, Nov. 1993.*

(Continued)

*Primary Examiner* — Keath Chen
(74) *Attorney, Agent, or Firm* — Robert E. Bushnell, Esq.

(57) ABSTRACT

A deposition source capable of uniformly producing a deposition film. The deposition source includes a furnace, a first heating unit surrounding the furnace to heat the furnace and a second heating unit spaced-apart from the first heating unit by an interval and surrounding the furnace to heat the furnace, wherein the second heating unit comprises a plurality of separate sub-heating units that surround the furnace.

15 Claims, 4 Drawing Sheets

(56) References Cited

OTHER PUBLICATIONS

Korean Office Action issued by KIPO, date Apr. 11, 2011, corresponding to Korean Patent Application No. 10-2009-0038451, together with Request for Entry.

Japanese Office Action issued by Japan Patent Office on Jun. 5, 2012, corresponding to Japanese Patent Application No. 2010-057418. And "Request for Entry of the prior art references" attached herewith.

* cited by examiner

DEPOSITION SOURCE

CLAIM OF PRIORITY

This application makes reference to, incorporates the same herein, and claims all benefits accruing under 35 U.S.C. §119 from an application for DEPOSITION SOURCE earlier filed in the Korean Intellectual Property Office on 30 Apr. 2009 and there duly assigned Serial No. 10-2009-0038451.

BACKGROUND OF THE INVENTION

1. Field of the Invention

The present invention relates to a deposition source capable of producing a deposition film having a uniform thickness throughout and a deposition device that includes the deposition source.

2. Description of the Related Art

Various techniques are employed in order to produce minute thin films for use in electronic devices. In particular, a flat panel display device is manufactured by producing a plurality of thin films, and thus it is important to improve the characteristics of the thin films.

From among flat panel display devices, an organic light emitting display device has been regarded as a next generation display device due to advantages such as a large viewing angle, excellent contrast, and rapid response speed in comparison to other flat panel display devices.

In the organic light emitting display device, an organic light emitting layer emitting visible light and an organic layer near the organic light emitting layer are produced by using various techniques. In particular, a vacuum deposition technique is frequently used due to its simple process. In the vacuum deposition technique, a deposition material in a powder or solid state is filled into a furnace and a deposition film is produced on a desired region by heating the furnace.

The vacuum deposition technique uses either a dot-type or a linear type deposition source. However, if the dot-type deposition source is used, a deposition material is spread from the dot-type deposition source over a wide substrate and thus uniformity of a deposition film can not be easily ensured.

Also, in the vacuum deposition technique using the linear type deposition source, powder is filled into a linear furnace and a deposition film is produced by heating the furnace. A heating unit is disposed around the linear furnace in order to heat the linear furnace.

However, due to characteristics of the linear furnace, the heating unit can not heat the linear furnace uniformly. Accordingly, the powder is not uniformly evaporated from the linear furnace and thus a deposition film can not be uniformly produced. What is needed is an improved design for a deposition source that can produce a deposition film having a uniform thickness throughout.

SUMMARY OF THE INVENTION

The present invention provides a deposition source capable of producing deposition film having improved thickness uniformity throughout.

According to an aspect of the present invention, there is provided a deposition source including a furnace, a first heating unit surrounding the furnace to heat the furnace and a second heating unit spaced-apart from the first heating unit by an interval and surrounding the furnace to heat the furnace, wherein the second heating unit comprises a plurality of separate sub-heating units that surround the furnace.

The plurality of sub-heating units can correspond to and heat different regions of the furnace. At least one of the plurality of sub-heating units can surround one side surface of the furnace and at least another of the plurality of sub-heating units can surround another side surface of the furnace to face the at least one of the plurality of sub-heating units. The first heating unit can surround an outer circumference of an upper portion of the furnace and the second heating unit can surround an outer circumference of a lower portion of the furnace. The first heating unit can surround an outer circumference of a lower portion of the furnace and the second heating unit can surround an outer circumference of an upper portion of the furnace. The first heating unit can include a plurality of separate sub-heating units that surround the furnace. The first and second heating units can be connected to external power sources and each of the first heating unit and ones of the plurality of sub-heating units can be connected to separate external power sources. Each of the first and second heating units can have a repeatable pattern such as a sine wave, a serpentine or a zigzag pattern.

The deposition source can also include sensor units arranged at sides of the furnace to monitor an amount of a deposition material evaporated from the furnace. The sensor units can be arranged at two opposite sides of the furnace and face each other.

Ones of the first heating unit and ones of the plurality of sub-heating units can be connected to separate ones of a plurality of external power sources, each of said external power sources can be independently controlled from each other. The deposition source can also include sensor units arranged at sides of the furnace to monitor rates of evaporated deposition material evaporated from different portions of the furnace. Ones of the external power sources can vary an amount of power delivered to corresponding portions of the furnace based on evaporation rates sensed by said sensor units.

According to another aspect of the present invention, there is provided a deposition device that includes a vacuum chamber, a substrate arranged at one end of the chamber, a deposition source arranged at an opposite end of the chamber and including a furnace, a first heating unit surrounding the furnace to heat the furnace and a second heating unit spaced-apart from the first heating unit by an interval and surrounding the furnace to heat the furnace, wherein the second heating unit comprises a plurality of separate sub-heating units that surround the furnace and a moving unit to move the deposition source within the chamber relative to the substrate.

The deposition device can further include a plurality of sensor units, each of said sensor units to measure a rate of evaporation from a region of said furnace. The deposition device can also include a plurality of power sources, wherein each of said first heating unit and said sub-heating units can be independently controlled by a different ones of said power sources based on measurements from ones of said sensor units.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

Figure 1:
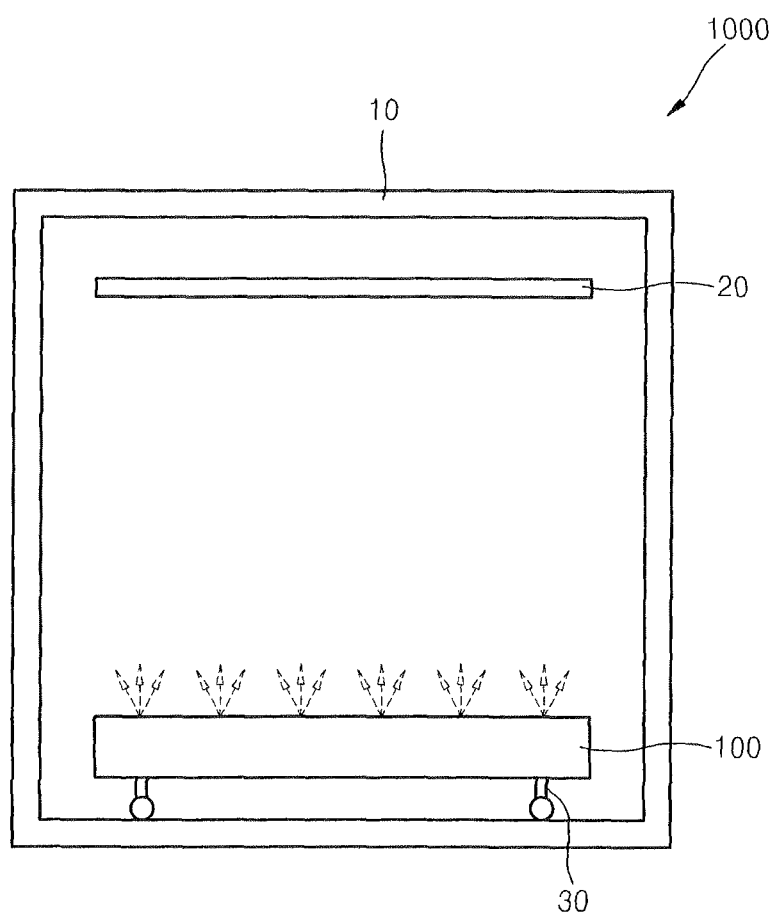
FIG. 1 is a front view of a deposition device including a deposition source according to a first embodiment of the present invention.
Figure 2:
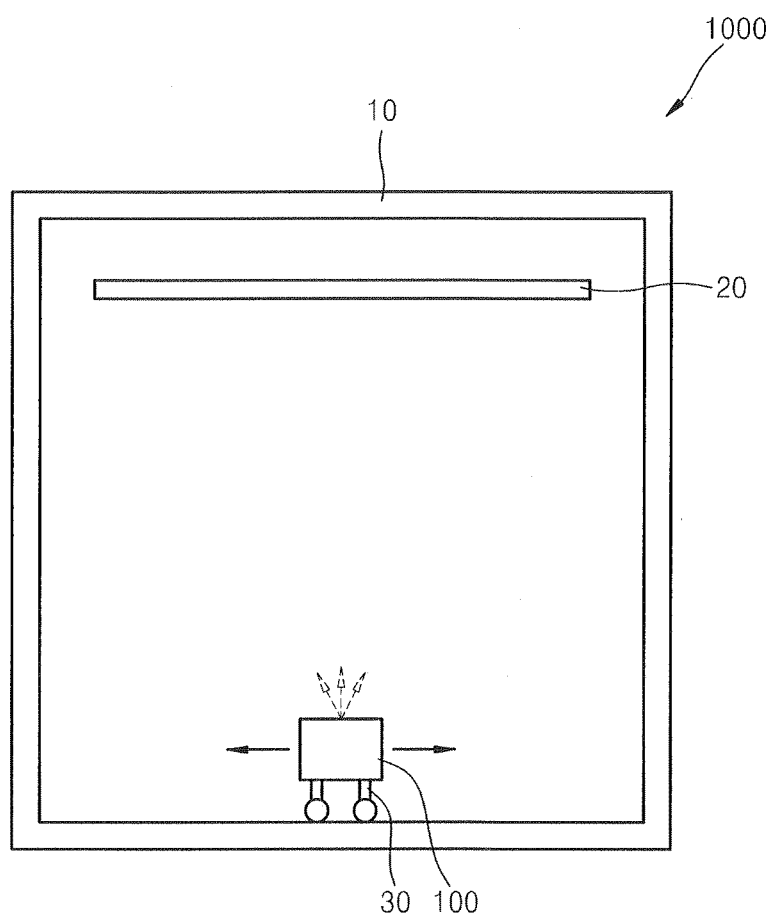
FIG. 2 is a side view of the deposition device illustrated in FIG. 1.

Turning now to the figures, FIG. 1 is a front view of a deposition device 1000 including a deposition source 100 according to a first embodiment of the present invention and FIG. 2 is a side view of the deposition device 1000 illustrated in FIG. 1. In more detail, FIG. 2 can be a left side view or a right side view of the deposition device 1000 of FIG. 1. Referring to FIGS. 1 and 2, the deposition device 1000 includes a substrate 20 and a deposition source 100 in a chamber 10.

In order to maintain a vacuum or low-pressure state, one or more pumps (not shown) are connected to the chamber 10. Also, one or more inlets (not shown) are formed on side surfaces of the chamber 10 to allow for movement of the substrate 20 into or out of the chamber 10.

The substrate 20 is a target on which a desired material is to be deposited, and is fixed by a clamp or a supporter. A deposition process can be performed after the substrate 20 is fixed.

The deposition source 100 is disposed to face the substrate 20 in the chamber 10. The deposition source 100 is a linear type deposition source that linearly extends in a length direction of the substrate 20.

Although the deposition source 100 linearly extends in one direction as illustrated in FIG. 1, a width of the deposition source 100 in the other direction is less than a length of the substrate 20 as illustrated in FIG. 2.

Since the deposition source 100 is a linear type deposition source that linearly extends in one direction, the deposition source 100 can move in order to deposit the material on an entire surface of the substrate 20. A moving unit 30 that moves in one direction or multiple directions is disposed under the deposition source 100. Due to the moving unit 30, the deposition source 100 can rectilinearly move and uniformly deposit the material on the substrate 20.

Figure 3:
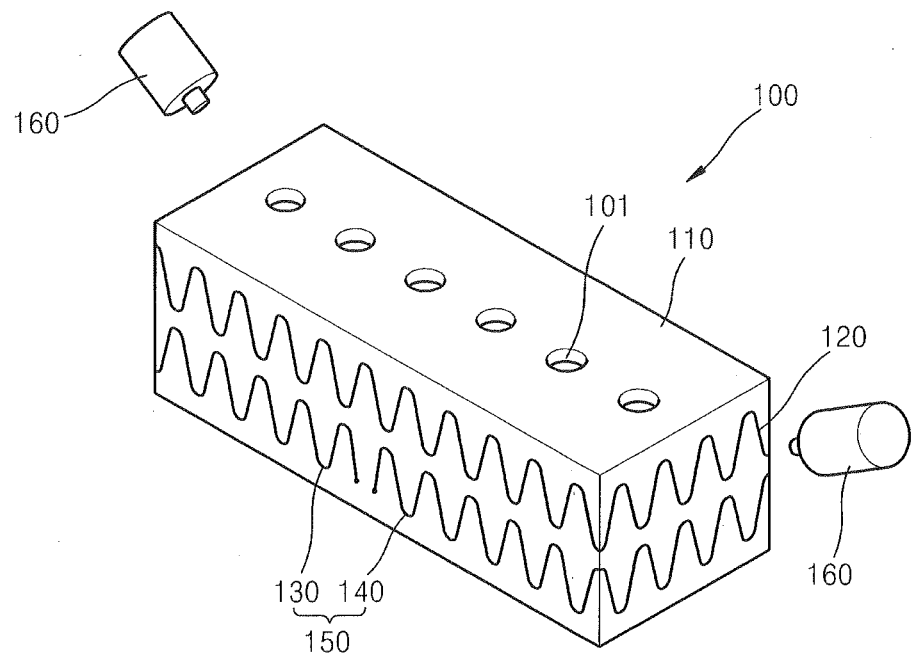
FIG. 3 is a perspective view of the deposition source illustrated in FIG. 1, according to an embodiment of the present invention.
Figure 4:
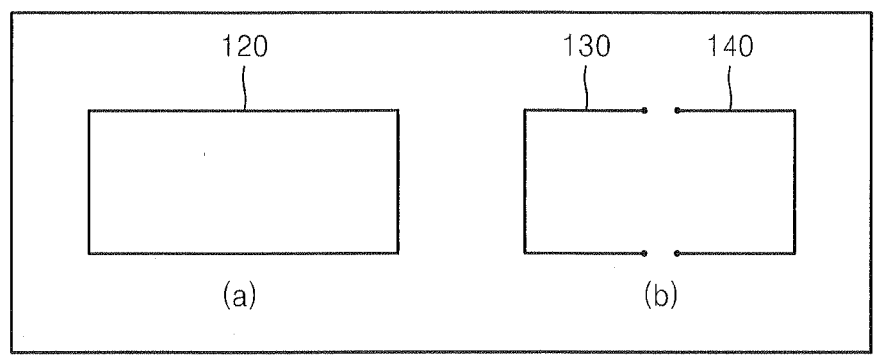
FIGS. 4a and 4b respectively are plan views of first and second heating units illustrated in FIG. 3.

Turning now to FIGS. 3, 4a and 4b, FIG. 3 is a perspective view of the deposition source 100 illustrated in FIG. 1, according to an embodiment of the present invention and FIGS. 4a and 4b are plan views of first and second heating units 120 and 150 respectively of FIG. 3. For convenience of explanation, the furnace 110 illustrated in FIG. 3 is not illustrated in FIGS. 4a and 4b.

Referring to FIG. 3, the deposition source 100 includes the furnace 110 and the first and second heating units 120 and 150. The furnace 110 is filled with a deposition material. In more detail, a deposition material for producing an organic light emitting layer of an organic light emitting diode (OLED) can be of a solid or powder state and be filled into the furnace 110, however the present invention is not limited thereto and deposition materials in various other states can instead be filled into the furnace 110.

The furnace 110 linearly extends in one direction. A length of the furnace 110 can correspond to the length of the substrate 20 illustrated in FIG. 1, on which the deposition material is to be deposited.

A plurality of outlets 101 are formed in a top surface of the furnace 110, i.e., a surface facing the substrate 20. When the deposition material filled in the furnace 110 is heated, evaporated deposition material moves through the outlets 101 and towards the substrate 20. The shape, size, and number of the outlets 101 can vary based on the size of the substrate 20, properties of the deposition material, and conditions of a deposition process.

The first and second heating units 120 and 150 are disposed around the furnace 110. The first and second heating units 120 and 150 can include coils in, for example, a sine wave, serpentine or zigzag pattern. Each of the coils is connected to one of several separate and independently controlled external power sources (not shown).

The first and second heating units 120 and 150 evaporate the deposition material, such as an organic material, filled within the furnace 110 by providing thermal energy to the furnace 110. The first heating unit 120 is disposed about an outer circumference of the furnace 110 so as to surround the furnace 110 at an upper portion of the furnace. The first heating unit 120 is connected to an external power source. Also, as illustrated in FIGS. 3 and 4a, the first heating unit 120 is integrally formed without being divided.

The second heating unit 150 is disposed about an outer circumference of the furnace 110 to surround furnace 110 at a lower portion of the furnace 110 while being spaced-apart from the first heating unit 120. The second heating unit 150 includes a plurality of separate sub-heating units that surround the furnace 110.

Referring to FIGS. 3 and 4b, the second heating unit 150 includes A and B sub-heating units 130 and 140. The A and B sub-heating units 130 and 140 are independent heating units and are connected to separate external power sources. Also, the external power sources connected to the A and B sub-heating units 130 and 140 are independent of the external power source connected to the first heating unit 120.

The A and B sub-heating units 130 and 140 are disposed to surround different regions of the furnace 110. Referring to FIGS. 3 and 4b, the A sub-heating unit 130 surrounds a left outer circumference of the furnace 110 and the B sub-heating unit 140 surrounds a right outer circumference of the furnace 110. The A and B sub-heating units 130 and 140 are spaced-apart from each other by an interval and the interval is preferably as small as possible in order to efficiently and uniformly transfer heat to the furnace 110.

In the current embodiment, the second heating unit 150 includes two sub-heating units, however the present invention is not limited thereto. Three or more sub-heating units can instead be used as the second heating unit 150 so as to correspond to different regions of the furnace 110.

The A and B sub-heating units 130 and 140 are connected to separate and independently controlled power sources. The A and B sub-heating units 130 and 140 surround and heat different regions of the furnace 110. As such, the A and B sub-heating units 130 and 140 can be separately controlled.

A linear type deposition source is developed in order to improve the non-uniform deposition characteristic of a conventional dot-type deposition source. However, thermal energy is not easily and uniformly delivered to the entire region of the furnace 110. In more detail, heat distribution on left and right regions of the furnace 110 that extends linearly is not uniform with reference to a length direction of the furnace 110. When a larger linear type deposition source is used to deposit an organic material onto a large substrate, it is more difficult to provide thermal energy uniformly across the entire furnace 110.

If thermal energy is not uniformly delivered to the entire region of the furnace 110, the deposition material filled within the furnace 110 can not be evaporated at a uniform rate. As a result, the evaporated deposition material will pass through different ones of the outlets 101 of the furnace 110 at different rates. Accordingly, the deposition material reaches the substrate 20 at different rates, producing a non-uniform deposition film thickness on the substrate 20.

However, the deposition source 100 according to the first embodiment includes the second heating unit 150 in addition to the first heating unit 120 that surrounds the furnace 110, and the second heating unit 150 is divided into the A and B sub-heating units 130 and 140. As such, the left and right regions of the furnace 110 can be uniformly heated. When the whole furnace 110 is uniformly heated, the deposition material within the furnace 110 is evaporated at a uniform rate across the furnace, producing a deposition film having a uniform thickness throughout the substrate 20.

In the first embodiment, sensor units 160 can be included so as to monitor the evaporation rate of the deposition material from the furnace 110. The sensor units 160 can be disposed at two opposite sides of the furnace 110 so as to face each other. The sensor units 160 can include various sensors used to monitor the rate of deposition material evaporated from the furnace 110 in real time, e.g., crystal sensors.

Figure 5:
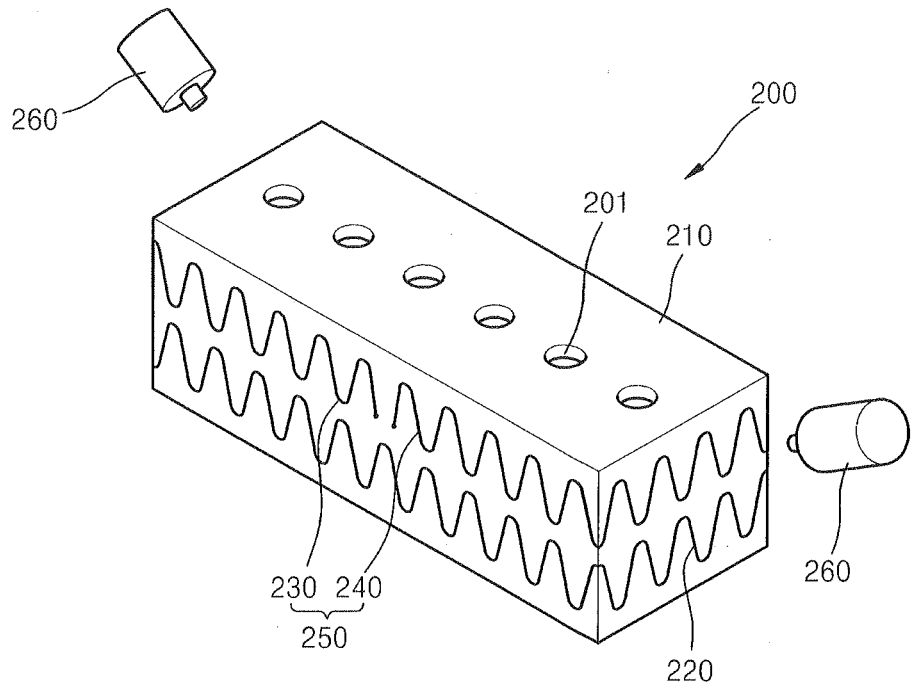
FIG. 5 is a perspective view of a deposition source according to a second embodiment of the present invention.

Turning now to FIG. 5, FIG. 5 is a perspective view of a deposition source 200 according to a second embodiment of the present invention. As in the first embodiment, deposition source 200 of FIG. 5 includes a plurality of outlets 201 arranged on an upper surface of furnace 210 and a plurality of sensor units 260 to measure the rate of passage of evaporated material through ones of the outlets 201. For convenience of explanation, differences from the first embodiment of FIG. 3 will be mainly described.

Referring to FIG. 5, the deposition source 200 includes a furnace 210 and first and second heating units 220 and 250. The first heating unit 220 is disposed about an outer circumference at a lower portion of the furnace 210 so as to surround the furnace 210. The first heating unit 220 is connected to an external power source. Also, the first heating unit 220 is integrally formed without being divided.

The second heating unit 250 is disposed on an outer circumference at an upper portion of the furnace 210 so as to be spaced-apart from the first heating unit 220 while surrounding the furnace 210. The second heating unit 250 includes a plurality of separate sub-heating units that surround the furnace 210. In FIG. 5, the second heating unit 250 includes A and B sub-heating units 230 and 240.

The A and B sub-heating units 230 and 240 are independent heating units in that they are connected to separate and independently controlled external power sources. Also, the external power sources connected to the A and B sub-heating units 230 and 240 are independent from the external power source connected to the first heating unit 220.

The A and B sub-heating units 230 and 240 are disposed to surround different portions of the outer circumference of the upper portion of the furnace 210. In FIG. 5, the A sub-heating unit 230 surrounds an upper left portion of the outer circumference of the furnace 210 and the B sub-heating unit 240 surrounds an upper right portion of the outer circumference of the furnace 210. The A and B sub-heating units 230 and 240 connected to separate power sources and surround and heat different regions of the furnace 210. As a result, the A and B sub-heating units 230 and 240 can be separately controlled.

As in the deposition source 100 illustrated in FIG. 3, the deposition source 200 of FIG. 5 can provide thermal energy uniformly across the entire furnace 210. As a result, a uniform thickness deposition film can be easily achieved on the substrate 20 illustrated in FIG. 1, even when deposition source 100 is replaced with deposition source 200 of FIG. 5.

Figure 6:
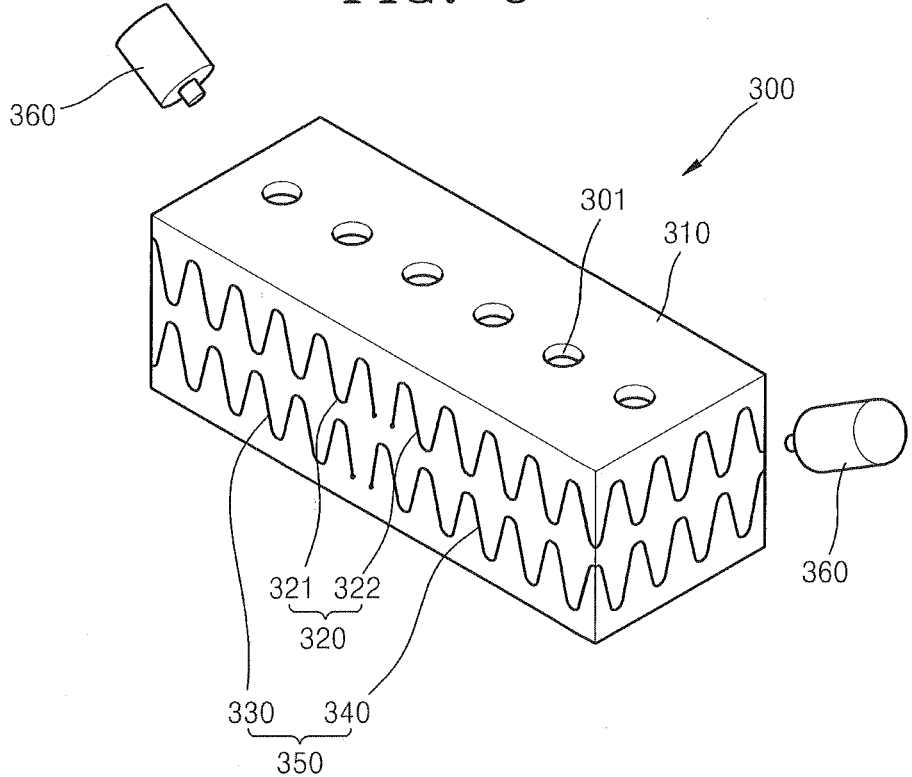
FIG. 6 is a perspective view of a deposition source according to a third embodiment of the present invention.

Turning now to FIG. 6, FIG. 6 is a perspective view of a deposition source 300 according to a third embodiment of the present invention. As illustrated in FIG. 6, deposition source 300 includes a furnace 310 having a plurality of outlets 301 on an upper side of the furnace 310, the deposition source further including a plurality of sensor units 360 to measure the rate of passage of evaporated material through ones of the outlets 301. For convenience of explanation, differences from the previous embodiments of FIGS. 3 and 5 will be mainly described.

Referring to FIG. 6, the furnace 310 further includes first and second heating units 320 and 350. The first heating unit 320 is disposed about an outer circumference of an upper portion of the furnace 310 so as to surround the furnace 310. The first heating unit 320 includes a plurality of separate sub-heating units that surround the furnace 310. In FIG. 6, the first heating unit 320 includes A and B sub-heating units 321 and 322.

The A and B sub-heating units 321 and 322 are independent heating units and are connected to separate and independently controlled external power sources. Also, the external power sources connected to the A and B sub-heating units 321 and 322 are independent from the external power sources connected to the second heating unit 350.

The second heating unit 350 is disposed about an outer circumference of a lower portion of furnace 310 and is spaced-apart from the first heating unit 320. The second heating unit 350 includes a plurality of separate sub-heating units that surround the furnace 310. In FIG. 6, the second heating unit 350 includes A and B sub-heating units 330 and 340.

The A and B sub-heating units 330 and 340 are independent heating units and are connected to separate and independently controlled external power sources. Also, the external power sources connected to the A and B sub-heating units 330 and 340 are independent of an external power source connected to the first heating unit 320.

In the third embodiment, the deposition source 300 includes the first and second heating units 320 and 350 connected to separate power sources and each of the first and second heating units 320 and 350 includes a plurality of sub-heating units. The sub-heating units surround and heat different regions of the furnace 310. Since each of the A and B sub-heating units 321, 322, 330 and 340 are independently controlled, conditions for heating the furnace 310 can be adjusted by monitoring a rate of deposition material evaporated different portions of furnace 310 by ones of the sensor units 360 during a deposition process so that furnace 310 can be easily and uniformly heated.

As such, the deposition source 300 can provide thermal energy uniformly to the entire region of the furnace 310. As a result, a uniform thickness deposition film can be easily produced on the substrate 20 of FIG. 1 when deposition source 300 is substituted for deposition source 100.

As described above, according to the present invention, a deposition source can uniformly heat the entire region of a furnace and thus a deposition film having a uniform thickness throughout can be produced.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A deposition source comprising:
   a furnace;
   a first heating unit surrounding the furnace to heat the furnace; and
   a second heating unit spaced-apart from the first heating unit by an interval and surrounding the furnace to heat the furnace,
   wherein the second heating unit comprises a plurality of separate sub-heating units that surround the furnace, wherein the deposition source is a linear-type deposition source having a length much longer than a width, wherein the first heating unit is integrally formed without being divided and extends around an outer circumference of the furnace, and wherein the second heating unit includes first and second sub-heating units spaced apart from each other, the first sub-heating unit surrounds a left outer circumference of the furnace and the second sub-heating unit surrounds a right outer circumference of the furnace.

2. The deposition source of claim 1, wherein the first heating unit surrounds an outer circumference of an upper portion of the furnace and the second heating unit surrounds an outer circumference of a lower portion of the furnace.

3. The deposition source of claim 2, wherein each of the first and second heating units have a repeatable pattern selected from a group consisting of a sine wave, a serpentine and a zigzag pattern.

4. The deposition source of claim 3, wherein the first heating unit is arranged at an upper portion of the furnace and the second heating unit is arranged at a lower portion of the furnace.

5. The deposition source of claim 1, wherein the first heating unit surrounds an outer circumference of a lower portion of the furnace and the second heating unit surrounds an outer circumference of an upper portion of the furnace.

6. The deposition source of claim 1, wherein the first and second heating units are connected to external power sources, and
   wherein each of the first heating unit and ones of the plurality of sub-heating units are connected to separate external power sources.

7. The deposition source of claim 1, further comprising sensor units arranged at sides of the furnace to monitor an amount of a deposition material evaporated from the furnace.

8. The deposition source of claim 7, wherein the sensor units are arranged at two opposite sides of the furnace and face each other.

9. The deposition source of claim 1, further comprising sensor units arranged at sides of the furnace to monitor rates of deposition material being evaporated from different portions of the furnace, wherein ones of the first heating unit and ones of the plurality of sub-heating units are connected to separate ones of a plurality of external power sources, wherein ones of the external power sources vary an amount of power delivered to corresponding portions of the furnace based on evaporation rates sensed by said sensor units.

10. A deposition device, comprising:
    a vacuum chamber;
    a substrate arranged at one end of the chamber;
    a linear-type deposition source having a length much longer than a width, being arranged at an opposite end of the chamber and including:
       a furnace;
       a first heating unit surrounding an outer circumference of the furnace to heat the furnace; and
       a second heating unit spaced-apart from the first heating unit by an interval and surrounding the outer circumference of the furnace to heat the furnace, wherein the second heating unit comprises a plurality of separate sub-heating units that surround portions of the furnace; and
    a moving unit to move the deposition source within the chamber relative to the substrate, the furnace having first through fourth sidewalls, the first and third sidewalls being opposite to each other and corresponding to the length of the deposition source, and the second and fourth sidewalls being opposite to each other, corresponding to the width of the deposition source and extending from the first sidewall to the third sidewall, the first heating unit being arranged on and extending a length of each of the first through fourth sidewalls, the second heating unit includes first and second sub-heating units spaced apart from each other, the first sub-heating unit of the second heating unit being arranged on the second sidewall and on portions of the first and third sidewalls that are closer to the second sidewall than to the fourth sidewall, the second sub-heating unit being arranged on the fourth sidewall and on portions of the first and third sidewalls that are closer to the fourth sidewall than to the second sidewall.

11. The deposition device of claim 10, further comprising a plurality of sensor units, each of said sensor units to measure a rate of evaporation from a region of said furnace.

12. The deposition device of claim 11, further comprising a plurality of power sources, wherein each of said first heating unit and said sub-heating units is independently controlled by a different ones of said power sources based on measurements from ones of said sensor units.

13. The deposition device of claim 10, the first heating unit is integrally formed without being divided, and being arranged at one of an upper and a lower portion of the furnace, the second heating unit being arranged at another of the upper and lower portion of the furnace and being spaced apart from the first heating unit in a vertical direction.

14. The deposition device of claim 13, wherein each of the first and second heating units have a repeatable pattern selected from a group consisting of a sine wave, a serpentine and a zigzag pattern.

15. The deposition device of claim 10, wherein each of the first and second heating units have a repeatable pattern selected from a group consisting of a sine wave, a serpentine and a zigzag pattern.

* * * * *